(12) United States Patent
Von Finck et al.

(10) Patent No.: US 12,366,445 B2
(45) Date of Patent: Jul. 22, 2025

(54) MEASURING APPARATUS AND METHOD FOR ROUGHNESS AND/OR DEFECT MEASUREMENT ON A SURFACE

(71) Applicant: ASML NETHERLANDS B.V., Veldhoven (NL)

(72) Inventors: Alexander Von Finck, Berlin (DE); Simon Halm, Berlin (DE); Ingo Juergen Markel, Dresden (DE); Maciej Neumann-Röbisch, Berlin (DE)

(73) Assignee: ASML NETHERLANDS B.V., Veldhoven (NL)

( * ) Notice: Subject to any disclaimer, the term of this patent is extended or adjusted under 35 U.S.C. 154(b) by 135 days.

(21) Appl. No.: 18/279,030

(22) PCT Filed: Mar. 3, 2022

(86) PCT No.: PCT/EP2022/055393
§ 371 (c)(1),
(2) Date: Aug. 25, 2023

(87) PCT Pub. No.: WO2022/189250
PCT Pub. Date: Sep. 15, 2022

(65) Prior Publication Data
US 2024/0183655 A1   Jun. 6, 2024

(30) Foreign Application Priority Data
Mar. 11, 2021 (DE) .................. 10 2021 105 946.1

(51) Int. Cl.
*G01N 21/88* (2006.01)
*G01B 11/30* (2006.01)
(Continued)

(52) U.S. Cl.
CPC ......... *G01B 11/303* (2013.01); *G01N 21/474* (2013.01); *G01N 21/8806* (2013.01);
(Continued)

(58) Field of Classification Search
CPC .. G01N 21/474; G01N 21/8806; G01N 21/94; G01N 2021/4783;
(Continued)

(56) References Cited

U.S. PATENT DOCUMENTS

| | | | |
|---|---|---|---|
| 8,310,665 B2* | 11/2012 | Hamamatsu | G01N 21/94 356/600 |
| 12,019,026 B2* | 6/2024 | Dave | G01N 21/71 |

(Continued)

FOREIGN PATENT DOCUMENTS

| | | |
|---|---|---|
| CN | 108332689 | 7/2018 |
| CN | 111707221 | 9/2020 |

(Continued)

OTHER PUBLICATIONS

International Search Report and Written Opinion issued in corresponding PCT Patent Application No. PCT/EP2022/055393, dated Jun. 9, 2022.

(Continued)

*Primary Examiner* — Kevin K Pyo
(74) *Attorney, Agent, or Firm* — Pillsbury Winthrop Shaw Pittman, LLP

(57) ABSTRACT

A measuring apparatus has at least two radiation sources arranged to illuminate a measuring region of a surface of a sample, the at least two sources configured to illuminate the measuring region along at least two illumination beam paths at different angles of incidence relative to a surface normal of the surface, a detector device configured to detect at least two scattered radiation images of surface sections in the illuminated measuring region at a predetermined viewing angle relative to the surface normal of the surface, portions of the scattered radiation received by the detector device, which portions are formed in each case by the illumination in one of the illumination beam paths, in each case having (Continued)

Figure 1:
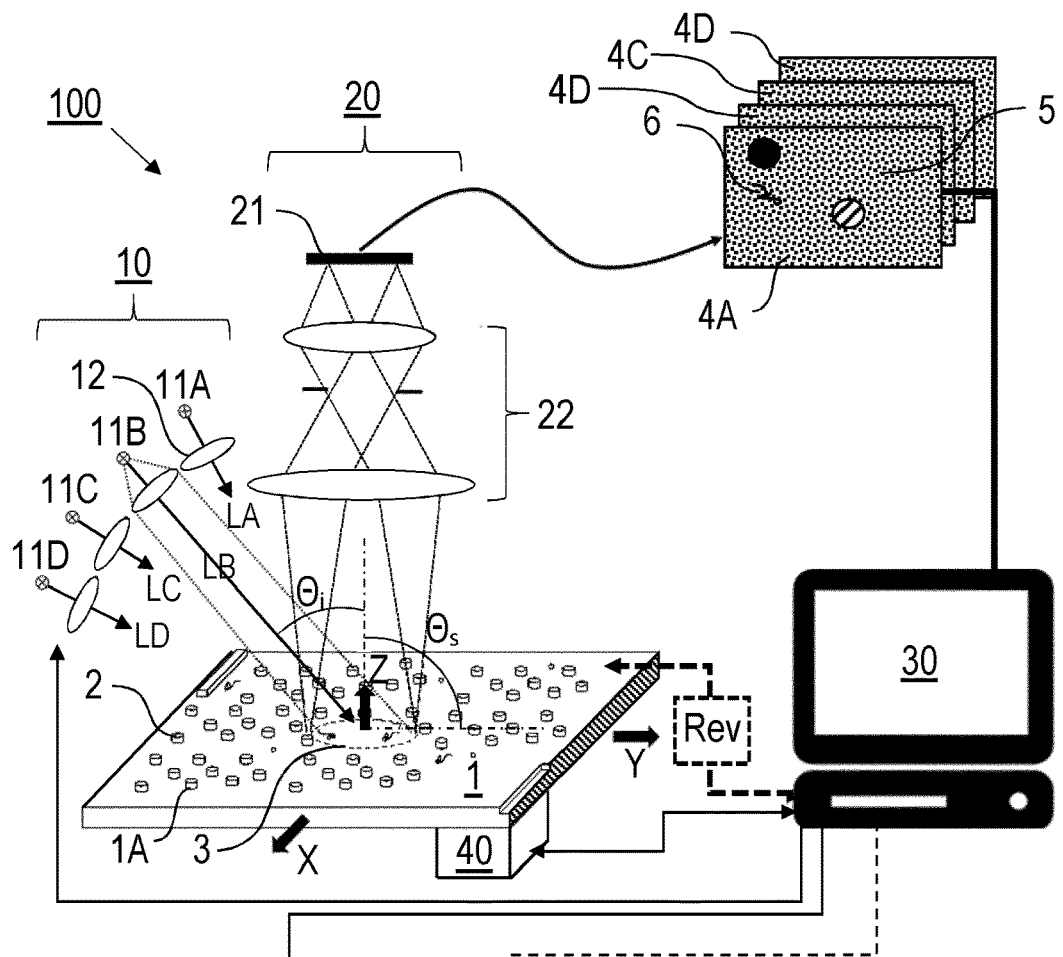

a common spatial frequency, and an evaluation device configured to determine at least one roughness feature of the surface sections from the at least two scattered radiation images.

20 Claims, 4 Drawing Sheets

(51) Int. Cl.
*G01N 21/47* (2006.01)
*G01N 21/94* (2006.01)

(52) U.S. Cl.
CPC ..... *G01N 21/94* (2013.01); *G01N 2021/4742* (2013.01); *G01N 2021/4783* (2013.01); *G01N 2021/8835* (2013.01); *G01N 2021/8845* (2013.01); *G01N 2021/8848* (2013.01); *G01N 2201/0612* (2013.01); *G01N 2201/062* (2013.01); *G01N 2201/08* (2013.01)

(58) Field of Classification Search
CPC ... G01N 2021/8835; G01N 2021/8845; G01N 2021/8848; G01N 2201/0612; G01N 2201/062; G01B 11/30; G01B 11/303
See application file for complete search history.

(56) References Cited

U.S. PATENT DOCUMENTS

| | | |
|---|---|---|
| 2009/0290168 A1 | 11/2009 | Hamamatsu et al. |
| 2016/0109381 A1 | 4/2016 | Pavani |
| 2017/0032177 A1 | 2/2017 | Suenaga et al. |
| 2018/0024346 A1 | 1/2018 | Inomata et al. |
| 2019/0056331 A1 | 2/2019 | Sun |
| 2020/0174240 A1 | 6/2020 | Kang et al. |

FOREIGN PATENT DOCUMENTS

| | | |
|---|---|---|
| DE | 4416108 | 5/2000 |
| DE | 102011118607 | 3/2013 |
| DE | 102012005417 | 9/2013 |
| JP | 2010002406 | 1/2010 |
| JP | 2014115144 | 6/2014 |
| JP | 2020128933 | 8/2020 |
| WO | 2013037833 | 3/2013 |

OTHER PUBLICATIONS

A. Von Finck et al., "International round-robin experiment for angle-resolved light scattering measurement"; AppliedOptics, vol. 58, No. 24, pp. 6638-6654 (2019).

M. Fouchier et al., "Wide-range wavelength and angle resolved light scattering measurement set-up", Optic Letters, vol. 45, No. 9, pp. 2506-2509 (May 1, 2020).

www.keyence.com/products/3d-measure/roughness-measure/vk-x3000/ (accessed on Oct. 16, 2024).

www.keyence.com/products/3d-measure/roughness-measure/vr-6000/ (accessed on Oct. 16, 2024).

P. Bousquet et al., "Scattering from multilayer thin films: theory and experiment", Journal of the Optical Society of America, vol. 71, No. 9, pp. 1115-1123 (1981).

A. Duparré et al., "Surface characterization techniques for determining the root-mean-square roughness and power spectral densities of optical components", Applied Optics, vol. 41, No. 1, pp. 154-171 (Jan. 1, 2022).

M. Zerrad et al., "Development of a goniometric light scatter instrument with sample imaging ability", Proc. of SPIE, vol. 7102, pp. 1-15 (2008).

S. Schröder et al., "Standardization of light scattering measurements", Adv. Opt. Techn., 4 (5-6), pp. 361-375 (2015).

E. L. Church et al., "Residual surface roughness of diamond-turned optics", Applied Optics, vol. 14, No. 8, pp. 1788-1795 (1975).

P.A. Bobbert et al., "Light Scattering by a Sphere on a Substrate", Physica, 137A, pp. 209-242 (1986).

Stover, J.C., "Optical Scattering: Measurement and Analysis", Third Edition, Society of Photo-optical Instrumentation Engineers, Chapters 1-13, 275 pages (2012).

* cited by examiner

MEASURING APPARATUS AND METHOD FOR ROUGHNESS AND/OR DEFECT MEASUREMENT ON A SURFACE

This application is a U.S. national phase entry of PCT Patent Application No. PCT/EP2022/055393 filed Mar. 3, 2022, which claims priority to German Patent Application No. 10 2021 105 946.1 filed Mar. 11, 2021.

The invention relates to a measuring apparatus and to a method for roughness and/or defect measurement on a plurality of surface sections of a surface of a sample to be investigated, in particular for roughness and/or defect measurement on a structured surface, such as burls of holding apparatuses for wafers. The invention can be applied in the investigation of surfaces, in particular of wafer holding apparatuses, e.g. for detecting a usage or processing state of the surface.

In the present description, reference is made to the following prior art, which represents the technical background of the invention:

[1] DE 10 2012 005 417 B4;
[2] M. Zerrad et al. "Development of a goniometric light scatter instrument with sample imaging ability" in "Proc. of SPIE" "Optical Fabrication, Testing, and Metrology III" Vol. 7102, page 710207 (2008), doi: 10.1117/12.797621;
[3] R. Bousquet et al. "Scattering from multilayer thin films: theory and experiment" in "Journal of the Optical Society of America" 71(9), 1115 (1981);
[4] A. Duparré et al. "Surface characterization techniques for determining the root-mean-square roughness and power spectral densities of optical components" in "Applied Optics" 41(1), 154-171 (2002);
[5] E. L. Church et al. "Residual surface roughness of diamond-turned optics" in "Applied Optics" 14(8), 1788-1795 (1975);
[6] J. C. Stover, Optical Scattering: Measurement and analysis, 3rd ed. (SPIE, Bellingham, Wash., 2012);
[7] P. Bobbert et al. "Light scattering by a sphere on a substrate" in "Physica A: Statistical Mechanics and its Applications" 137, 209-242 (1986); and
[8] Sven Schroder, Alexander von Finck and Angela Duparré "Standardization of light scattering measurements" in "Adv. Opt. Techn." 2015; 4(5-6): 361-375.

Holding apparatuss for holding components, such as for holding silicon wafers in lithographic semiconductor processing, in particular in chip production, are generally known. If the holding is achieved using electrostatic forces, a holding apparatus is also referred to as an electrostatic holding apparatus, electrostatic clamping device, electrostatic clamp (ESC), or electrostatic chuck. A holding apparatus typically comprises a shape of a plate having at least one planar carrier surface, by which the held component is carried. The carrier surface is formed by a plurality of protruding burls, in particular by plane end faces of the burls. For example thousands of burls are provided, each having an end face diameter in the sub-mm region.

It is generally known that the roughness of the end faces of the burls, and the possible appearance of defects, such as contaminations and/or material damages, decisively influence the interaction properties, such as friction, adhesion and slipperiness, between the wafer and the ESC. The interaction properties between the burls and the wafer in turn have a decisive effect on lateral instabilities when clamping the wafer, and they thus influence the achievable quality and the overlap accuracy of structures from different manufacturing steps (overlay) in the case of lithographic structuring.

For accurate and reliable manipulation of wafers, the roughness should be set so as to be as reproducible as possible, and possible defects reliably identified. In this case, roughness structures having high spatial frequencies, for example over 0.3 $\mu m^{-1}$, are of particular interest. Furthermore, impairment of the evenness of the held wafer and the quality of the lithography process by defects, in particular coarse roughness structures or impurities, such as particles or material damage on the end faces, is intended to be prevented. It is therefore of interest to detect the roughness of the burl end faces during production, during operation, and/or in the case of reworking of an ESC.

A conventional investigation method which is typically used in practice comprises measuring the roughness using an atomic force microscope (AFM). Individual burls are approached and investigated using the AFM. Although it is possible to directly measure roughness structures having high spatial frequencies by means of the AFM, it is disadvantageous that the AFM has a very small measuring field, typically smaller than 50×50 $\mu m^2$, the AFM measurement is extremely time-consuming, and the use of the AFM is therefore limited to studying a few representative burls. Measuring all the ESC burls on a surface of for example 300 mm diameter would require approximately 200 days, which is not practical. Accordingly, in practice local roughness fluctuations on the carrier surface, or impurities, cannot be detected or can be detected only unreliably, by means of the AFM measurement. Furthermore, the AFM does not allow for comprehensive detection of defects.

Alternatively, the burls can also be measured by means of white light interferometry (WLI). Although this allows for a higher measuring speed than when using the AFM, it requires a measuring time which is excessively long for practical applications. Furthermore, on account of the low-pass properties of the imaging objective, only spatial frequencies of up to approximately <0.3 $\mu m^{-1}$ can be reliably detected by the larger WLI measuring field.

It is known from [1], [3], [4], [5] and [6] to detect the power spectral density function (PSD function), characteristic for the roughness, of optical components, such as lenses, by means of a scattered light measurement. Typically, for this purpose, the scattered light distribution at a local measuring point of the sample is acquired by means of an angle scanning detector. In the method described in [1], a measuring spot on the surface of the investigated sample is illuminated at different angles or using different wavelengths, and the light scattered at the measuring spot is acquired at a plurality of viewing angles by means of a plurality of detectors. The PSD function is determined from the detector signal. However, a disadvantage of this method is that it measures punctually and only locally, and is therefore very time-consuming as a laterally scanning method. Detection of all the individual burls of an ESC would last approximately 2 days, which is approximately the same as the WLI measuring time. Moreover, the conventional method provides only limited information on the causes of increased scattering. Furthermore, the method according to [1] has a limited field of application, since the spatial resolution is limited by the diameter of the illumination spot.

A further scanning scattered light measurement is the goniometric method known from [2], in which an illumination light source scans relative to the sample, and a scattered light image of the light scattered at different illumination angles is acquired by means of a camera detector. This method is suitable for example for detecting particles on wafer surfaces. It is possible to determine, from the scattered light image, whether and where scattering particles are present in the imaged region. If particles are detected, a precise study of a surface section can be provided, in a locally restricted manner. The method according to [2] is also characterized by a high time requirement and a limited field of application.

Conventional scanning scattered light methods furthermore have the disadvantage that typically measuring field diameters of from 1 mm to 3 mm are achieved, such that in the case of the measurement on an ESC a plurality of burls would be illuminated simultaneously. Although complex illumination optics can make it possible to achieve a measuring field diameter of less than 0.2 mm, this requires an accurate absolute positioning system (sample coordinates), and the individual positions of the burls have to be detected accurately and transmitted to the positioning system. Furthermore, upon detecting the burl end faces, there would be a risk of scattered light of the edge structures, or diffraction effects, being superimposed on the scattered light of the topography of the end faces. Measures for preventing this risk would slow down the scanning process. Furthermore, small scattering angles of approximately <2° to 5° cannot be detected, because, for a measuring field diameter of <0.2 mm, the illumination beam has to be focused on the sample, rather than in the detector plane, as is otherwise conventional. The specular illumination beam is thus reflected in a divergent manner, and is superimposed on the scattered light at a small scattering angle.

The mentioned restrictions, in particular with respect to the speed, spatial resolution and spatial frequencies of the roughness measurement or defect identification arise not only in the case of the measurement on burl end faces, but rather also in the case of measurements on other components, such as on surfaces of optical components, in particular lenses, wedges or mirrors.

The object of the invention is to provide an improved measuring apparatus and an improved method for roughness and/or defect measurement on a plurality of surface sections of a surface of a sample to be investigated, by means of which disadvantages and limitations of conventional techniques are avoided. The invention is intended in particular to make it possible to perform the roughness and/or defect measurement at an increased speed and/or precision, detect structures having increased spatial frequencies, reduce the processing complexity of the data processing, and/or deliver the result of the roughness and/or defect measurement having an increased information content. The roughness and/or defect measurement should in particular be suitable for reliable and quick detection of the roughness of the burls of holding apparatuss for wafer holding, as far as possible at a measuring time of approximately one hour or less when detecting all the burls.

This object is achieved in each case by a measuring apparatus and a method which comprise the features of the independent claims. Preferred embodiments and applications of the invention result from the dependent claims.

According to a first general aspect of the invention, the above object is achieved by a measuring apparatus which is configured for roughness and/or defect measurement on a plurality of surface sections of a surface of a sample to be investigated, in particular on a structured surface, such as burl end faces of a holding apparatus for wafer holding.

The measuring apparatus comprises an illumination device having at least two light sources which are arranged for illuminating a measuring region of the surface with measuring light, the measuring region including the plurality of surface sections. According to the invention, the at least two light sources are configured for illuminating the surface sections in the measuring region along at least two illumination beam paths at different angles of incidence relative to a surface normal of the surface. Furthermore, the at least two light sources can be fixed with respect to the detector device.

The measuring apparatus further comprises a detector device having a detector array consisting of a plurality of detector pixels which are arranged for detecting scattered light scattered at the surface. According to the invention, the detector device is provided with imaging optics by means of which the measuring region of the surface is imaged on the detector array, the detector device being configured for capturing at least two scattered light images of the illuminated measuring region at a predetermined viewing angle relative to the surface normal of the surface, and portions of the scattered light received by the detector pixels, in each of the illumination beam paths, in each case have a common spatial frequency.

Furthermore, the measuring apparatus comprises an evaluation device which is configured for determining at least one roughness feature of the surface, from the captured scattered light. According to the invention, the evaluation device is configured for determining the at least one roughness feature for each surface section from the at least two scattered light images.

According to a second general aspect of the invention, the stated object is achieved by a method for roughness and/or defect measurement on surface sections of a surface of a sample to be investigated, in particular on a structured surface, such as burl end faces of a holding apparatus for wafer holding.

The method for roughness and/or defect measurement comprises the steps of illuminating a measuring region of the structured surface with measuring light along at least two illumination beam paths at different angles of incidence relative to a surface normal of the surface, the measuring region containing the plurality of surface sections, capturing scattered light scattered on the surface using a detector device comprising a detector array consisting of a plurality of detector pixels, and determining at least one roughness feature of the surface from the captured scattered light.

According to the invention, the illumination comprises a directed illumination of the surface sections in the measuring region using at least two fixedly arranged light sources along at least two illumination beam paths at different angles of incidence relative to a surface normal of the surface. The detector device, which is provided with imaging optics by means of which the illuminated measuring region of the surface is imaged on the detector array, captures at least two scattered light images of the illuminated measuring region at a predetermined viewing angle relative to the surface normal of the surface, wherein portions of the scattered light received by the detector pixels, in each of the illumination beam paths, in each case have a common spatial frequency. The at least one roughness feature is determined, for each surface section, from the at least two scattered light images.

The method according to the invention for roughness and/or defect measurement, or an embodiment thereof, is preferably carried out using the measuring apparatus according to the first general aspect of the invention, or an embodiment thereof.

The measurement of the roughness and/or detection of defects, according to the invention, is performed on surface sections of a surface. Each surface section is a part of the surface from which scattered light is imaged on an individual detector pixel or a group of detector pixels. All the surface sections considered are preferably of the same shape and surface area. The entirety of the surface sections can cover the investigated surface, completely or in part.

The measurement of the roughness, and/or detection of defects, is preferably performed on a structured surface. The term "structured surface" refers to any surface that is closed or interrupted, i.e. made up of partial surfaces, preferably comprising parts, delimited from one another, having different surface structures or textures. In the case of structured surfaces, the surface sections considered are particularly preferably parts of the structured surface having the same surface structures or textures in each case, i.e. the surface sections are parts of the surface that are delimited from one another and have the same surface structures or textures, locally, which differ from the surface structures or textures of the remaining surface.

For example, the sample to be investigated comprises a holding apparatus for electrostatic holding of components, a plurality of protruding burls being arranged on the surface of the holding apparatus. The surface of the holding apparatus forms the structured surface, the surface sections comprising end faces of the burls.

In a manner deviating from the method known from [1], according to the invention at least two light sources are arranged such that the at least two different illumination beam paths are formed having different angles of incidence relative to the surface normal of the surface. Measuring light is directed to the sample at the at least two different angles of incidence, each light source being arranged for illuminating at one of the angles of incidence. In particular during the recording of the at least two scattered light images, the light sources are fixed relative to the detector device. The amplitude of the scattered light detected by the detector device is determined, at each angle of incidence, by the scattering of the measuring light at scattering structures, with a defined spatial frequency. In other words, at each angle of incidence, a scattered light image with a different spatial frequency is detected. This advantageously allows determining the roughness feature in a larger spatial frequency range, in particular at spatial frequencies in the spatial frequency range from 0.005 $\mu m^{-1}$ to 100 $\mu m^{-1}$.

Including high spatial frequencies in determining the at least one roughness feature is particularly advantageous for the roughness and/or defect measurement at burl end faces of holding apparatuses, e.g. ESCs, since the structures having high spatial frequencies particularly influence the adhesion properties of the burls, and thus the function of the holding apparatuses and the features thereof, and in particular prevent lateral instabilities when clamping a wafer.

The roughness and/or defect measurement takes place in a different manner compared with the method described in [2] in the case of firmly set angles of incidence. A movement of a light source for setting different angles of incidence is avoided, as a result of which the structure of the measuring apparatus is simplified, and the roughness measurement is accelerated. A further advantage of the illumination using firmly set angles of incidence is that the fixed angles of incidence allow fixed positioning of beam traps, which are optionally provided, which beam traps absorb direct reflections from the surface and thus suppress stray light by light scattering of the reflections within the measurement system. In the case of the method described in [2], beam traps would have to be carried along with the reflection, as a result of which the complexity of the conventional measurement increases.

Furthermore, in a manner deviating from [1], on account of the imaging optics being provided, the detector device is configured for image acquisition. Advantageously, simultaneous detection of the amplitudes of the scattered light of a plurality of surface sections is made possible, as a result of which a full-surface roughness and/or defect measurement is significantly accelerated, and higher lateral resolutions can be achieved more easily. A high resolution is advantageous even for surface section identification, defect identification, and defect categorisation. In the case of the method described in [1], for this purpose the illumination spot size must be significantly reduced, the disadvantages already described (long measuring time, superimposition of small scattering angle due to the necessary focusing) resulting.

The term "roughness feature" refers to any quantity or data amount, such as a function course, which quantitatively represents the roughness (unevenness of the surface height of the investigated surface). The roughness feature is a measure for topographical unevenness and/or for unevenness due to defects. It is advantageously possible to identify different roughness features of the surface sections. The at least one roughness feature to be identified may for example be selected depending on the requirements in a specific application. The roughness feature is preferably derived from an ARS value (ARS: Angle Resolved Scattering) and/or a variable obtained therefrom, such as a value of the integral scattering and/or at least one PSD function (power spectral density function), from which an rms roughness (rms: root mean square) can be determined. Particularly preferably, the PSD function and/or the rms roughness is acquired as the roughness feature.

Defects include contamination and/or material damage on the surface, in particular the surface sections considered. The defects are preferably identified from the at least one roughness feature and/or the angle resolved scattering.

According to an advantageous embodiment of the invention, the illumination device can be configured for time control of the at least two light sources, such that the at least two scattered light images can be recorded in a manner temporally separated from one another, wherein the evaluation device is configured for determining PSD functions of the surface sections in the illuminated measuring region from the at least two scattered light images, and the illumination device is configured for calculating the at least one roughness feature for each surface section from the scattering function, in particular ARS function, of the surface section.

The time control of the at least two light sources in such a way that the at least two scattered light images are recorded sequentially and in a manner temporally separated from one another comprises a successively alternating activation of one of the light sources in each case, such that the activated light source is on, while all other light sources are inactive (turned off or screened). The PSD function of each surface section is determined, in a manner known per se, from the amplitudes of the scattered light images, as is explained in greater detail below. The calculation of the at least one roughness feature for each surface section can include for example calculation of a roughness value from the average PSD function of the surface section and/or a PSD variance within the surface section.

A PSD function can be determined for each detector pixel of the detector array of the detector device. If scattered light from a single surface section, e.g. from a burl, is received by a plurality of detector pixels, e.g. 2 to 20 detector pixels, an average scattered light amplitude can be calculated for each surface section, and the PSD function can be determined from the average scattered light amplitudes at the different angles of incidence. Alternatively, the PSD functions, calculated per pixel, can also be averaged. The averaging advantageously makes it possible to reduce the amount of data to be processed. Furthermore, using a plurality of detector pixels per surface section offers advantages for identifying defects.

Alternatively or in addition it is possible, according to a further advantageous embodiment of the invention, for the illumination device to be configured for intensity control such that it is possible to record the at least two scattered light images, at each of the surface sections, having weighted irradiances (energy per surface area) of the directed illumination by the at least two light sources. It is preferably provided for the at least two scattered light images to be recorded simultaneously at each of the surface sections or at groups of surface sections, with the weighted irradiances.

The weighted irradiances of the directed illumination are provided by the at least two light sources at each of the surface sections, in that the irradiances, e.g. the illumination intensities of the light sources, are set such that the light sources correspond to a uniform hemispherical illumination. The weighted irradiances (E) are in particular set so as to be proportional to $\sin(\theta_i)\cos(\theta_i)$, $\theta_i$ being the angle of incidence of the illumination of the individual surface sections. In this case, the evaluation device is configured for determining the integral scattering (S function or S values) or in particular total scattering (TS function or TS values, equal to the integral scattering in the scattering angle range of 2 to 85°), of the structured surface in the illuminated measuring region, from the at least two scattered light images, and for calculating the at least one roughness feature for each surface section, from the integral scattering on the surface section.

The embodiment of the invention comprising intensity control and simultaneous recording of the at least two scattered light images has the particular advantage that the scattered light images can be recorded using just one single instance of illumination, such that the measuring duration is significantly reduced.

The intensity control of the illumination device is achieved in particular such that each of the surface sections is illuminated by the weighted irradiance, in that the light sources are actuated at different energies, in particular different powers, pulse durations, and/or pulse width modulations, and/or predetermined reducers are provided in the illumination beam paths, in particular at the light sources. Reducers preferably comprise beamforming optics and/or location-variable reducers, such as grey filters.

The embodiments of the invention comprising time control and comprising intensity control can be combined, such that the information content of the measurement is advantageously increased.

The number of light sources can advantageously be selected depending on the specific usage conditions of the invention, in particular depending on the desired speed of the measurement. Two light sources are sufficient for providing the at least two illumination beam paths, for example in order to construct a PSD function. A larger number of light sources may be advantageous for increasing the accuracy of the measurement, but also leads to an increased duration of the measurement, including the data processing. The number of light sources of the illumination device is preferably selected so as to be in the range of 3 to 70 or more, e.g. up to 100. In a practical application of the roughness measurement on a holding apparatus, for example 10 to 60 light sources are provided. In a suitable configuration of the light sources, e.g. optical fibres, the ends of which radiate, it is also possible for more light sources, e.g. up to 100 light sources or more, to be provided.

The light sources are preferably arranged in at least one azimuthal plane perpendicularly to the surface of the investigated sample, resulting advantageously in a compact configuration. Alternatively, the light sources can be of a different arrangement, in particular can be arranged on a plurality of sides beside the detector device. In particular, the illumination along the illumination beam paths can be achieved at different azimuthal angles, in particular in a plurality of azimuthal planes, wherein advantages are achieved in the identification or suppression of interfering local reflections or high variance coefficients, which can be superimposed on nearby measuring points. In addition, this arrangement simplifies the identification of anisotropic surface structures and defects.

According to a further advantageous embodiment of the invention, the illumination device is configured for generating the measuring light in all the irradiation beam paths so as to be of the same wavelength. In this case, the construction of the measuring apparatus and the determination of the at least one roughness feature is simplified.

According to an alternative embodiment of the invention, the illumination device is configured for generating the measuring light in all the radiation beam paths so as to be of different wavelengths and/or of different polarisations. Different wavelengths are provided for example by using light sources having suitable spectral emissions. In order to provide different polarisations, for example adjustable polarising beam splitters and/or polarisation filters are used. Advantageously, additional degrees of freedom are provided in the selection of the spatial frequencies detected in the illumination beam paths. Furthermore, it is made easier to detect whether a scattering structure is a surface defect or a surface structure, or whether it scatters in a non-topographical manner, such that defects can be better identified. If defects are identified, a decision regarding subsequent cleaning of the surface preferably may be made. Alternatively, if a surface structure is identified, post-processing of the surface, e.g. of the burl end faces, preferably may take place. This possibility for distinction advantageously allows a significantly reduced post-processing process time, and reduced outlay.

According to preferred variants of the use of different wavelengths in the illumination beam paths, the illumination device is configured for generating the measuring light in at least one of the illumination beam paths so as to have at least two different wavelengths and/or so as to have at least two different polarisations.

The evaluation device is particularly preferably configured for determining at least two PSD functions, in particular having equal spatial frequencies (i.e. common spatial frequencies or spatial frequency ranges), of the surface sections in the illuminated measuring region, and/or at least two instances of integral scattering, in particular having the same spatial frequency ranges, and for identifying structures on the surface sections from the at least two PSD functions and/or at least two instances of integral scattering. Structures on the surface sections can be acquired from deviations, for example differences or quotients, of the at least two PSD functions and/or at least two instances of integral scattering. Distinguishing between defects and surface structures is advantageously further simplified thereby.

According to a further embodiment of the invention, the evaluation device is configured for identifying the surface sections in the measuring region, in particular in the scattered light images. The determination of the at least one roughness feature can in particular be achieved, for each surface section, from the at least two scattered light images. It may alternatively be provided for just a partial group of the surface sections to be evaluated. The identification of the surface sections, in particular in the scattered light images, improves the accuracy of the determination of the at least one roughness feature, and undesired interference by possible scattered light from edge structures of the surface sections or due to diffraction effects, can be detected and prevented.

It is advantageously possible for image regions in the scattered light images to be associated with the surface sections (deterministic structure) and to be distinguished from stochastic structures such as defects or impurities. The calculation of the at least one roughness feature can be restricted to the surface sections. Furthermore, information can also be averaged over the individual surface sections.

The identification of the surface sections can be achieved by means of an image recognition method to which the scattered light images are subjected. According to a particularly preferred embodiment of the invention, the evaluation device is configured for identifying the surface sections by using neural networks and/or machine learning methods. This embodiment of the invention is characterized by the combination of an imaging scattered light measurement method, which is tuned to extremely high spatial frequencies, with learning numerical methods. Advantageously, the reliability of the identification of the surface sections can be increased thereby, even when defects are present.

The evaluation device is preferably configured for identifying structures on the surface sections from the at least two scattered light images by using digital image masks. Digital image masks include e.g. predetermined reference images of predetermined shapes and/or dimensions, which are characteristic of defects which are expected on the surface. Defects include for example contaminations with foreign materials, such as particles or fibres, or material damages, such as edge fractures or cracks. Comparing the image masks with the scattered light images makes it possible for the defects to be identified and optionally to undergo classification (e.g. dust, fibre, edge fracture, etc.) and/or size determination. The use of digital image masks advantageously makes it possible to accelerate the evaluation of the scattered light images.

The image masks can in particular make it easier to evaluate the scattered light images only in part, for example to calculate the roughness from the scattered light data only in the surface sections, in particular on the burls. In the case of identified particles it is possible, in an analogous manner, the scattered light data of the particles can be extracted using the image masks in order to use other evaluation algorithms for size determination. The mask creation and the defect categorisation can be achieved by means of machine learning methods (in particular neural networks). The evaluation of the extracted scattered light data can conventionally be performed using models that are known per se, it being possible for the model selection to be made in a manner dependent on the identified defect type. For example, individual particles can be assessed using the Bobbert Vlieger model for size determination from the ARS data, defects can be assessed by size determination by means of pixel-counting/surface determination, and/or burls can be assessed by means of a surface roughness calculation from ARS data using the Rayleigh Rice model.

According to a further preferred embodiment, the imaging optics of the detector device is a telecentric optic, which offers advantages for the construction of the measuring apparatus because no complicated separate optics are required.

According to the invention, it is sufficient for the scattered light images to be recorded by the detector device at a fixed viewing angle relative to the surface of the investigated sample. The viewing angle of the detector device preferably extends in parallel with the surface normal of the surface of the investigated sample. The telecentric optic is advantageous in that the viewing angle or scattering angle is identical for each pixel, and thus the spatial frequency is also the same for all the pixels. This is also advantageous in that lateral dimensions can be measured more accurately on account of the preferably perpendicular viewing of the sample, in the entire field of view. Furthermore, the solid angle is the same for all the pixels, which is advantageous for the calibration.

Further advantages, in particular for studying burl end faces of a holding apparatus, result if the illumination device is configured for directed illumination of the surface sections at a shallow angle of incidence in the range of 88° to 75° using measuring light having a small wavelength $\lambda<300$ nm, and the evaluation device is configured for determining a skewness parameter of the surface sections. The skewness parameter is a statistical quantitative measure for the type and extent of the topographical asymmetry of the individual end faces from their average value. Determining the skewness parameter makes it possible to determine particular interaction properties of the wafer with the burls, which properties are in turn decisive for lateral distortions of the wafer.

According to a further advantageous embodiment of the invention, at least one further detector device is provided, comprising imaging optics and a detector array with a plurality of detector pixels, the at least one further detector device being configured for capturing at least two scattered light images of the illuminated measuring region at at least one further viewing angle relative to the surface normal of the surface. For example, at least one second detector device is provided, which forms a larger viewing angle, with respect to the sample normal of the investigated sample, than the first detector device. It is thus advantageously possible to detect structures having still higher spatial frequencies.

A further embodiment includes at least one illumination, the angle of incidence of which is selected such that the direct specular reflection strikes at least one additional detector. It is advantageously possible to determine a local reflection coefficient of the sample by means of the measured value of the additional detector, which increases the accuracy of the evaluation. In order to determine the reflection coefficient at an angle of incidence in parallel with the surface normal, it is possible to use a beam splitter in the optical path of the detection beam path, which makes it possible to both view the sample in parallel with the surface normal, and to illuminate said sample in parallel with the surface normal.

A further advantage of the invention is that the illumination device is not restricted to particular types of light sources. The term "light source" refers to any form of luminous element which is arranged for illumination of the sample, to be investigated, at a predetermined angle of incidence.

The light source is preferably an actively luminous element, such as a light-emitting diode or a laser, the emission of which is directed towards the sample. Light-emitting diodes or lasers have advantages on account of the availability of components having high illumination intensities, the availability of narrow-band emitters, and the directed emissions. Light-emitting diodes may be advantageous on account of their incoherence, because no interfering speckle patterns are generated on the sample. Lasers may include for example laser diodes or solid-state lasers.

Alternatively, the light source contains a passively luminous element (illuminated element), such as an optical fibre, in particular a fibre end of an optical fibre, or a reflector, in combination with a light-emitting diode or a laser. A plurality of or all of the optical fibres can be coupled to a common light-emitting diode or a common laser. In these variants, advantages result for the dense arrangement of a plurality of light sources, e.g. fibre ends, for setting a plurality of angles of incidence.

The illumination device may comprise light sources of the same or different variants, which differ in their angle of incidence. For example, lasers and/or light-emitting diodes that illuminate the sample directly can be combined with optical fibres which are coupled to the same or further lasers and/or light-emitting diodes.

Each light source is preferably provided with an illumination optic. The illumination optic offers advantages for the orientation of the illumination towards the sample and/or the forming of the illuminated measuring region on the surface of the sample. If the light source comprises a light-emitting diode or an optical fibre, the illumination optic is preferably a collimating lens. If the light source comprises a laser, the illumination optic is preferably a combination of an expander lens and a collimating lens. Alternatively, for less intrinsic scattered light of the instances of illumination, or in order to improve aberrations and transmission or reflection losses over a wider spectral range of the illumination, mirror optics can also be used.

A scattered light image can cover the entire surface of the sample to be investigated. Alternatively, a scattered light image can cover a portion of the surface of the sample to be investigated, and the entire surface can be captured by repeated measurements in different portions. In the latter case, according to a further preferred embodiment of the invention, a sample holder for receiving the sample, and/or the assembly consisting of the illumination device and the detector device, are movable relative to one another, such that the illumination device can be arranged for illuminating different measuring regions (portions) of the structured surface, and the scattered light images of the different measuring regions can be captured by the detector device, the measuring apparatus being configured for repeated roughness measurement at surface sections in the different measuring regions of the structured surface. Each portion comprises at least two, typically at least 20, surface sections. In the case of the roughness measurement on a holding apparatus, a portion covers for example approximately 50 burl end faces.

The roughness measurement advantageously may be combined with further investigation and/or processing methods. For example, according to preferred variants of the invention, selected surface sections, in particular having increased roughness, can additionally be purposely investigated using an interferometric, topographic and/or spectroscopic measuring method, in particular interferometry, confocal microscopy, fluorescence spectroscopy, or Raman spectroscopy. Processing of the sample can include for example preparation in the measuring region and/or surface treatment of the sample, such as polishing. The further study and/or processing method is preferably subsequently carried out after the roughness measurement according to the invention. Alternatively, study before the roughness measurement is also possible.

Particularly preferably, at least one subsequent second measuring method, preferably the interferometric, topographic and/or spectroscopic measuring method, such as interferometry (in particular white light interferometry), confocal microscopy, fluorescence spectroscopy, or Raman spectroscopy, is provided, in order to purposely measure individual identified defects or structures again. Surface sections having increased roughness and/or increased deviations between at least two PSD functions and/or at least two integral scatterings of the surface sections are preferably investigated, since these deviations can indicate defects or in particular contamination. The additional information and data, available as a result, can then be used for obtaining more accurate information relating to the structures and defects (e.g. pass/fail), or for training and improving the evaluation accuracy of the neural networks from the scattered light measuring data. Furthermore, other product properties, which are known from previous or subsequent measurements using other measurement methods, such as wear resistance, can be correlated with the data of the roughness measurement according to the invention, for example by adjusting or training evaluation algorithms or neural networks. In addition it is also possible to expand the detectable spatial frequency range as a result.

In the case of a topographic measurement method, at least one further measurement can be performed using the detector device, wherein a changed focal plane is set. As a result, the topography of the surface can be reconstructed. For example, local angles of inclination of the surface structures or sections can be determined, relative to the lateral extent of the sample in a common measuring region in which the roughness measurement according to the invention is carried out. It is advantageously possible, as a result, for local angles of incidence and scattering angles to be accurately determined, for calculating the at least one roughness feature, and for the accuracy of the evaluation to be improved.

Preferably a focus variation measurement (also referred to as a "shape from defocus" method) and/or a Makyoh imaging measurement (Makyoh topography measurement) may be provided as the topographical measurement method. In the case of the focus variation measurement, which is preferably carried out in dark field, a variation (scanning) of the focal plane of the detector device and a detection of the focal plane take place at which individual image textures are sharpest, from which a height profile, in particular a local surface inclination, of the surface is determined. In the case of Makyoh imaging, which is preferably carried out in bright field, at least one camera image is preferably acquired outside the focus. Local sample curvatures influence the intensity of the out of focus image, which makes it possible to calculate the height profile, in particular the local surface inclination. For this calculation, for example a homogeneous incident illumination distribution in the measuring region, and a constant local reflection coefficient, are assumed. Alternatively, the incident illumination distribution and the local reflection coefficient can also be calculated by calibrating the detector device using samples having a known reflection.

The features disclosed in connection with the measuring apparatus and the embodiments thereof also constitute preferred features of the method according to the invention, and vice versa. The above-mentioned aspects and inventive and preferred features, in particular with regard to the construction of the measuring apparatus as well as the dimensions and compositions of the individual components, which are described in connection with the measuring apparatus, therefore also apply for the method. The preferred embodiments, variants and features of the invention, described above, can be combined with one another.

Figure 2:
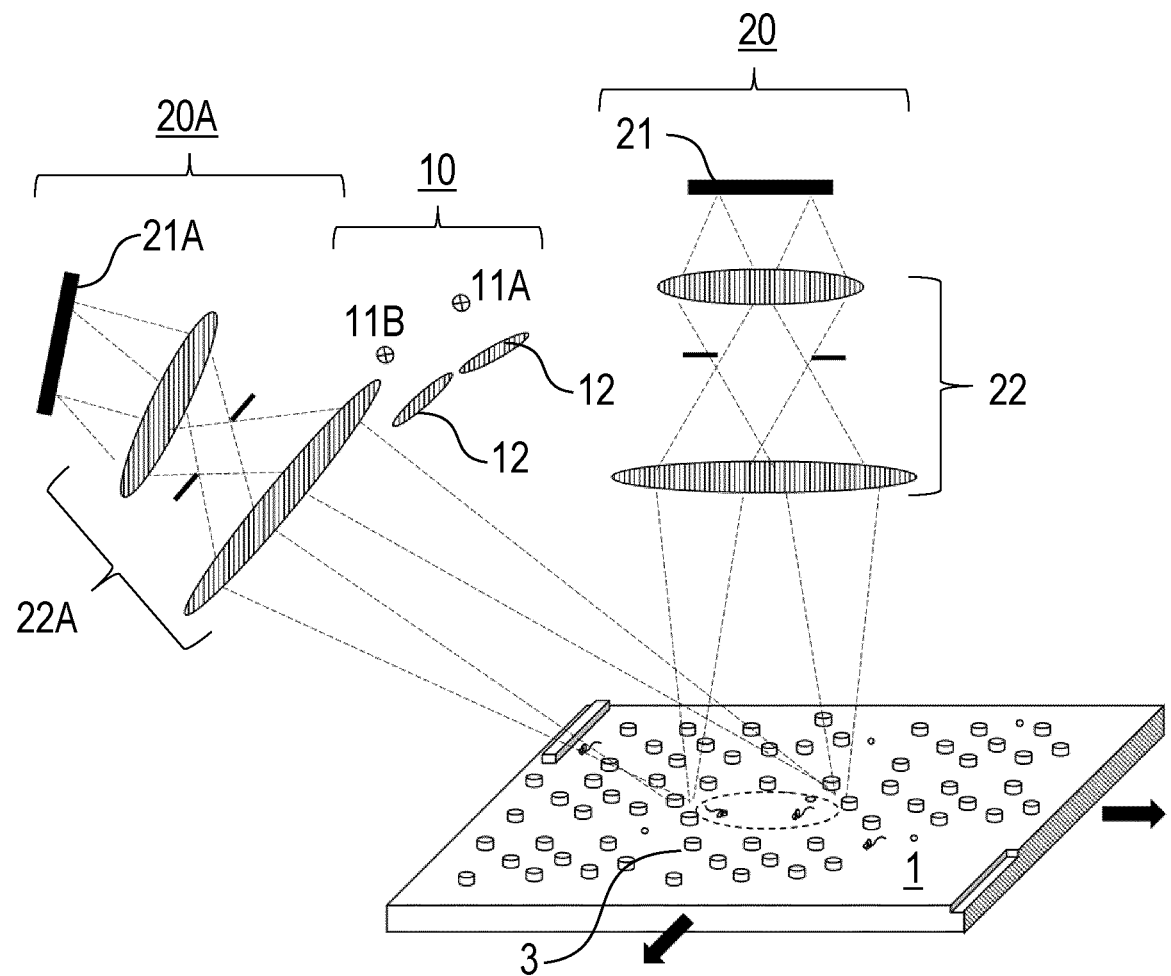
Figure 3:
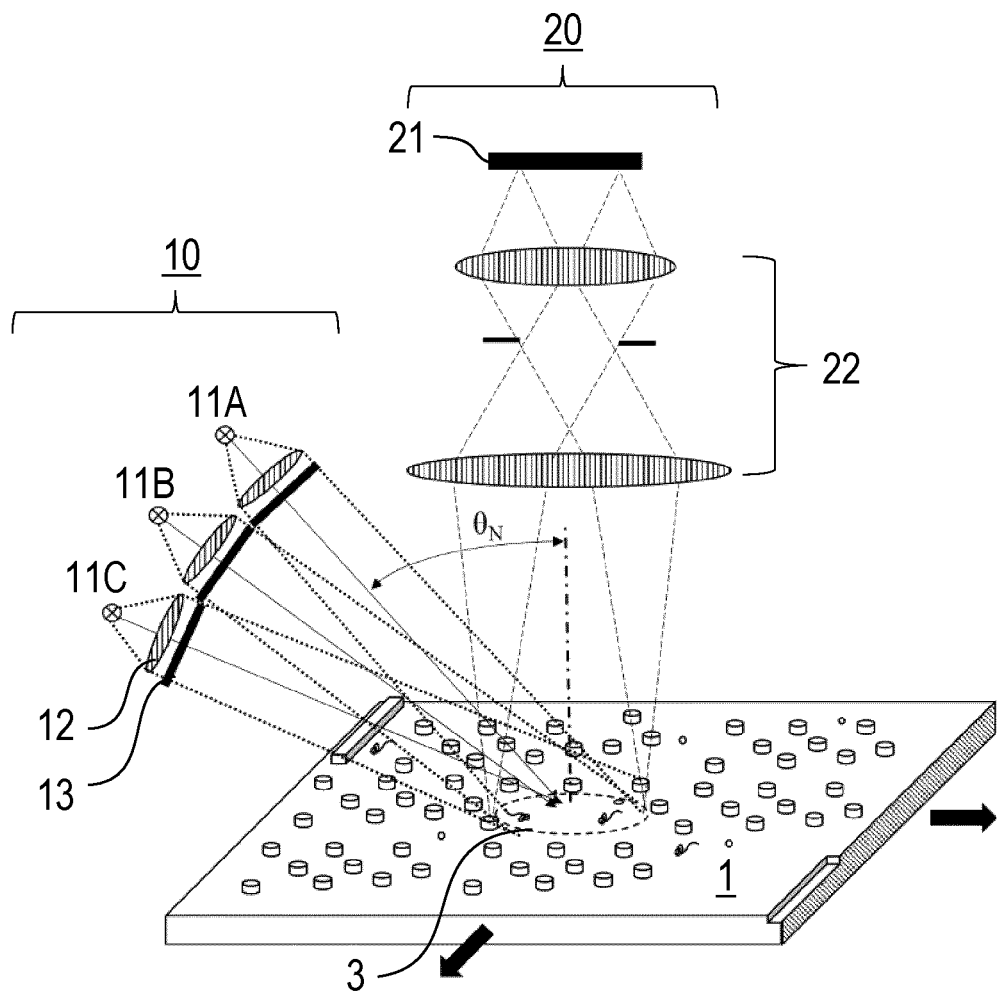
Figure 4:
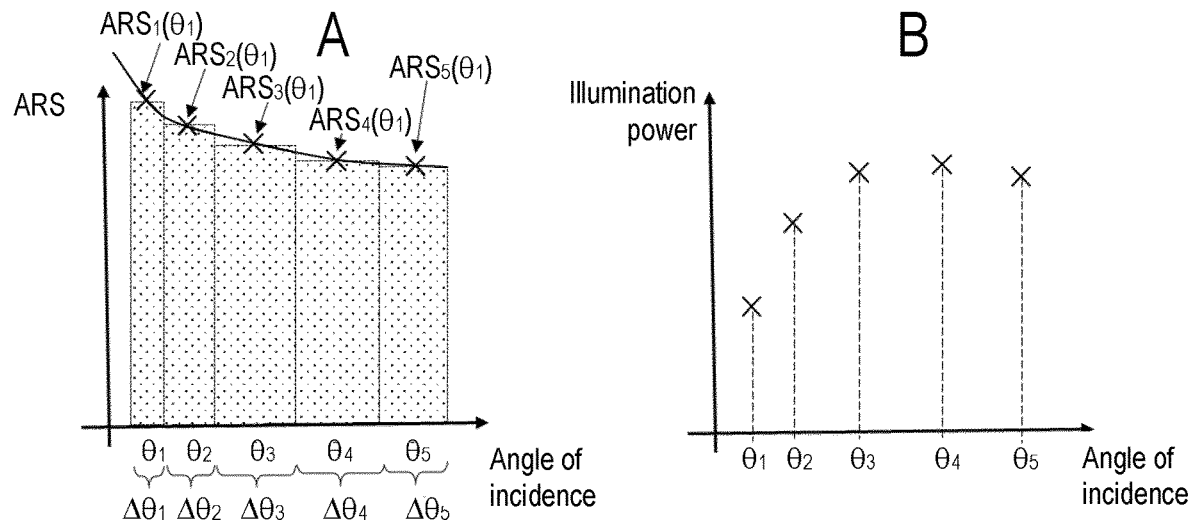
Figure 5:
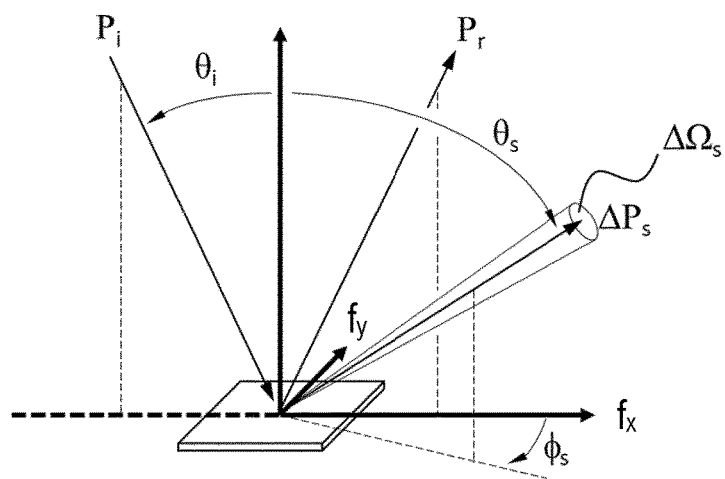

Further details and advantages of the invention will be described in the following, with reference to the accompanying drawings. The drawings show schematically:

FIG. 1: features of preferred embodiments of the measuring apparatus and of the method for roughness and/or defect measurement with time control of the light sources;

FIG. 2: a modified embodiment of the measuring apparatus according to FIG. 1, comprising a plurality of detector devices;

FIG. 3: a further modified embodiment of the measuring apparatus with intensity control of the light sources;

FIG. 4: illustrations of the function of the measuring apparatus according to FIG. 3; and FIG. 5: illustrations of angles and directions to which reference is made when determining at least one roughness feature.

Features of embodiments of the invention will be described in the following with reference, by way of example, to the roughness and/or defect measurement on a sample in the form of a planar ESC 1 (portions of which are schematically shown). It is emphasised that the application of the invention is not restricted to measurement on a planar ESC, but rather also includes measurements on other holding apparatuses comprising burls, which span a carrier surface, and on other planar or curved components, such as optical mirrors or lenses or bonded plates. In the case of measurements on curved components, direction specifications, such as the surface normal, refer locally to the respective directions in the current measuring region of the measurement. When describing the determination of at least one roughness feature, reference is made to angles, directions, and further variables, which are shown in FIG. 5.

The drawings are schematic illustrations which show features of embodiments of the invention. Details of the described configurations, such as a carrier of light sources, a camera housing, or a sample holder, are not shown, as far as these are known per se from the prior art.

By way of example, reference is made to embodiments of the invention in which scattered light from the sample is detected in reflection, i.e. the illumination and detector devices are arranged in a common half space on one side of the sample. The invention can be applied in a corresponding manner if the scattered light from the sample is detected in transmission, i.e. the illumination device and the detector device are arranged in different half spaces on opposing sides of the sample.

The top part of FIG. 1 schematically shows a measuring apparatus 100 for roughness and/or defect measurement on the ESC 1, which device comprises an illumination device 10, a detector device 20 comprising a camera, an evaluation device 30, and a sample holder 40. The configuration of the evaluation device 30 and the method performed by the evaluation device 30 for determining at least one roughness feature, including determining a roughness and/or identifying defects, are illustrated in the bottom part of FIG. 1.

The evaluation device 30 comprises a computer unit which is configured for executing data processing programmes for processing scattered light image data recorded by the detector device 20.

The evaluation device 30 is preferably also provided with a control unit for controlling the measuring apparatus 100. Alternatively or in addition, in order to control the measuring apparatus 100 an additional control unit (not shown) can be provided separately from the evaluation device 30.

The ESC 1 is in the shape of a plane plate, on the surface of which a plurality of burls 1A, each having an end face 2, is arranged. The ESC 1 is shown schematically, in a detail view, having just a few burls 1A. In practice, for example a dense arrangement of several tens of thousands of burls 1A at spacings of less than 3000 μm is provided, the end faces 2 of which burls each have a diameter of less than 0.5 mm and span the carrier surface of the ESC 1 for a wafer. The ESC 1 extends in a reference plane (here: X-Y plane), and the surface normal of the ESC 1 extends perpendicularly to the reference plane (here: Z-direction). The end faces 2 are preferably located in a common plane in parallel with the reference plane. The depth of focus and the axial chromatic aberration of the camera preferably allows for sharp imaging in both planes and at different wavelengths simultaneously, or it is possible to record the planes simultaneously and sharply using the camera, by means of refocussing. Optionally, the topography and/or local variations in height of the surface of the ESC 1 can be detected for example by a focus variation measurement and/or a Makyoh imaging measurement.

The ESC 1 is arranged on the sample holder 40 (shown schematically), which comprises for example an xy-stage for holding and moving the ESC in the X-Y plane. The position of the ESC 1 relative to the illumination device 10 and the detector device 20, and in particular the measuring region 3 illuminated by the illumination device 10, within the overall surface of the ESC 1, can be set by means of the sample holder 40.

The illumination device 10 contains a group of light sources 11A, 11B, 11C, 11D which each comprise a light-emitting diode, e.g. of the type M300L4 (340 nm wavelength, 53 mW power, manufacturer Thorlabs GmbH). The light sources 11A, 11B, 11C, 11D are fastened on a common carrier and/or housing (not shown) and each provided with an illumination optic (collimation optic) 12. It is optionally possible for at least one light source, and preferably all the light sources, to be provided with a displaceable reducer, such as a grey filter (see FIG. 3). The reducers can be retracted and extended in the beam paths of the respective light sources, in order to increase the dynamic of the measurement.

The illumination optic 12 of the light sources 11A, 11B, 11C, 11D each comprises a collimation lens for forming a collimated illumination beam path LA, LB, LC and LD towards the ESC 1. The light sources 11A, 11B, 11C, 11D and the associated illumination optics 12 are arranged so as to be fixed in such a way that each of the illumination beam paths LA, LB, LC and LD forms a different angle of incidence $\theta_i$, relative to the surface normal of the surface of the ESC 1, and is directed to the common measuring region 3. On account of the illumination optics 12 used, the illumination in the illumination beam paths LA, LB, LC and LD is typically round or elliptical, and larger than the measuring region 3 considered. The measuring region 3 is for example of a rectangular or quadratic shape, which is adapted to the shape of a detector array 21 of the detector device 20, wherein the measuring region 3 in particular has a side length in the range of from 0.1 cm to 10 cm.

By way of example, four light sources are shown, it being possible in practical use, for further light sources, e.g. a total of 10 or more light sources, to be provided. The angles of incidence can for example be arranged so as to be distributed in the range of from 2° to 75°. The angles of incidence are preferably distributed in the range in such a way that they allow for scanning of the detected spatial frequencies which is as uniform as possible. Thus, according to equation (1) (see below) a higher density of light sources results at small angles of incidence. If scattering structures having particular spatial frequencies are expected on the sample, the angles of incidence can preferably be set according to the range of the expected spatial frequencies.

The light sources 11A, 11B, 11C, 11D, together with the associated illumination optics 12, have a fixed position and orientation relative to the detector device 20, and accordingly also relative to the X-Y plane. The fixed position and orientation are set at least during the operation of the measuring apparatus 100, for the duration of the recording of all the scattered light images, in order to determine the at least one roughness feature. For the purpose of an adaptation to amended measuring conditions, the light sources 11A, 11B, 11C, 11D, together with the associated illumination optics 12, can be releasably fixed and adjustable on the carrier or in the housing.

The illumination device 10 and the sample holder 40 are coupled to the control unit of the evaluation device 30 (see the double arrow) or to a separate control unit. The control unit provides time or optionally intensity control of the light sources 11A, 11B, 11C, 11D, and positioning of the ESC 1, as described in further detail below.

The detector device 20 comprises a camera having a detector array 21, e.g. of the OrcaFusion type (manufacturer Hamamatsu), and an imaging optic 22, which is preferably a telecentric optic. The detector device 20 is arranged so as to have a fixed viewing angle $\Theta_s$ relative to the surface normal of the surface of the ESC 1. The viewing angle is preferably 0°, i.e. the optical axis of the detector device 20 extends in parallel with the surface normal (Z-direction). Alternatively, the viewing angle can deviate from 0° (see e.g. FIG. 2).

The detector array 21, such as a CMOS matrix, comprises a plurality of detector pixels for spatially resolved recording of scattered light in the event of illumination of the measuring region 3 along the illumination beam paths LA, LB, LC and LD. Output signals of the detector array 21 are a plurality of scattered light images 4A, 4B, 4C, 4D, . . . of the same measuring region 3, the number of which images, in the embodiment involving time control of the illumination device, being at least identical to the number of light sources. Upon recording of illumination series, e.g. in order to increase the reliability of the identification of deterministic structures or defects, the number of scattered light images 4A, 4B, 4C, 4D is preferably the same as a whole-number multiple of the number of light sources. Illumination series can be configured for example having different integration times, in order to increase the dynamics and thus for example obtain HDR (high-dynamicrange) images. The scattered light images 4A, 4B, 4C, 4D are delivered to the evaluation device 30, by means of which the method for determining the at least one roughness feature is carried out.

According to a first embodiment of the invention, time control of the light sources 11A, 11B, 11C, 11D is provided such that the scattered light images 4A, 4B, 4C, 4D, . . . are recorded in a manner temporally separated from one another, for each angle of incidence. During recording of the scattered light images 4A, 4B, 4C, 4D, . . . , the position of the detector device 20 remains unchanged. The light sources 11A, 11B, 11C, 11D are activated in succession, by means of the evaluation device 30. One of the light sources, in each case, is activated for a predetermined illumination duration, e.g. 40 ms, while all the other light sources are deactivated. At each illumination phase using one of the light sources, a scattered light image is recorded and transmitted to the evaluation device 30. For example, 10 scattered light images 4A, 4B, 4C, 4D, . . . of a 25×25 mm² measuring field can be recorded within just 0.5 s, which images differ in terms of the illumination beam paths LA, LB, LC, LD, . . . .

Each scattered light image is an amplitude image which is characterized in that the scattered light amplitudes recorded individually at the detector pixels are in each case determined by light scattering at structures, such as surface sections 2, particles 5, or fibres 6, having a common spatial frequency f according to [6]

$$f=[\sin(\Theta_s)-\sin(\Theta_i)]/\lambda \qquad (1)$$

(see FIG. 5, $\Theta_s$: viewing or scattering angle, $\Theta_i$: angle of incidence, $\lambda$: wavelength of the illumination). The spatial frequency f can alternatively be calculated according to $$f=\sqrt{f_x^2+f_y^2}. \qquad (2)$$

the following applying for $f_x$ and $f_y$:

$$f_x=(\sin\,\theta_s\,\cos\,\phi_s-\sin\,\theta_i)/\lambda\ und\ f_y=(\sin\,\theta_s\,\sin\,\phi_s)/\lambda. \qquad (3)$$

$\phi_s$ being an azimuthal angle relative to the axis which extends perpendicularly to the surface normal and is located in the incident plane which is spanned by the direction of the illumination having the angle of incidence $\theta_i$ and the surface normal (see FIG. 5). The spatial frequencies $f_x$ and $f_y$ therefore relate to the coordinates of the scattering geometry defined by the direction of the incident beam. If the incident beam is not located in the X-axis of the sample, i.e. rotated about an azimuthal angle $\phi_i$ about the surface normal, the spatial frequencies are transformed as follows, by rotation onto sample spatial frequencies $f_x$ and $f_y$:

$$f_X=f_x\,\cos\,\phi_i+f_y\,\sin\,\phi_i,\,f_Y=-f_x\,\sin\,\phi_i+f_y\,\cos\,\phi_i$$

The scattered light amplitudes in the scattered light images are defined by the angle resolved scattering ARS according to [6]

$$ARS(\theta_s, \phi_s, \theta_i) = \frac{\Delta P_s(\theta_s, \phi_s, \theta_i)}{P_i \Delta\Omega}. \qquad (4)$$

$\Delta\Omega$ denoting the solid angle, $\Delta P_s$ denoting the scattered power, and $P_i$ denoting the incident power (see FIG. 5).

With the evaluation device 30, the PSD functions of the surface sections 2 in the illuminated measuring region 3 are determined from the scattered light images 4A, 4B, 4C, 4D, . . . , and said functions are output as a roughness feature of the associated surface sections 2, or at least one derived roughness feature of the associated surface section 2, such as the rms value, is calculated from each PSD function.

Alternatively, the integral scattering S of the surface sections 2 in the illuminated measuring region 3 is determined from the scattered light images 4A, 4B, 4C, 4D, . . . , and at least one derived roughness feature of the associated surface sections 2, such as the rms value, is calculated from each S-value. Alternatively or in addition, the evaluation device 30 identifies and characterizes defects on the ESC surface, from the scattered light images 4A, 4B, 4C, 4D, . . . .

In detail, in a step S1 (bottom part of FIG. 1), it is determined, using image recognition methods which are available per se, optionally using a neural network, whether a scattering structure is a deterministic structure, i.e. a surface section 2. If this is not the case, in a step S2 it is determined, by means of image recognition, whether a scattering structure includes a defect. In this case, a classification according to expected defects, such as particles 5, fibres 6, material fractures, or cracks, is carried out, in order to subsequently characterize the relevant defect more precisely. Accordingly, step S2 includes a plurality of sub-steps, of which FIG. 1 shows, merely by way of example, the sub-step of identifying whether a defect is formed by a particle.

When using a neural network for image recognition, the neural network can be continuously adapted by machine learning. For this purpose, information from a topographic review process Rev (see below) and/or from other local and/or global measurements (such as hardwearing nature of the sample) can be used. As a result, it is possible to also predict later product properties which are related only indirectly to the measured values. In addition, it is possible as a result to continuously improve the accuracy of the derivation of local product properties (such as surface roughness of a structure, or the size of a defect).

If, following steps S1 and S2, a scattering structure has not been identified as a surface section 2 or as a defect, the associated data can be discarded and the image recording repeated, and/or the scattering structure can be approached individually and investigated using a different measuring method and/or a higher spatial resolution.

If, in steps S1 and S2, deterministic structures or defects are identified, by checking a quantitative degree of error, at a level of reliability that is sufficient for no further image recording to be required for the subsequent calculation of the at least one roughness feature, the light sources can accordingly be controlled such that no further illumination is carried out, in order to save measuring time.

After identification of surface sections 2 in step S1, these are cut out, in steps S3 and S4, by using digital masks within the scattered light images 4A, 4B, 4C, 4D, ... (selecting the structures according to their local position on the sensor matrix), in order to subsequently determine ARS values in each of steps S5 and S6, and to calculate therefrom, in steps S7 and S8, taking into account the viewing geometry (solid viewing angle Ω of the detector device), the PSD functions of the scattering structures on the surface sections 2. The ARS values follow directly from the detected scattered light amplitudes, i.e. the output signals of the detector pixels.

The relation between the PSD function in each pixel within the selected structure, depending on the spatial frequency f and the ARS value, follows according to (see e.g. [3])

$$PSD(f) = ARS(\theta_s, \phi_s) \frac{\lambda^4}{16\pi^2 \cos\theta_i \cos^2\theta_s Q} \quad (5)$$

In equation (5), Q is an optical factor which contains information on the scattering geometry (angle of incidence and scattering angle, light polarisation) and material properties (complex refractive index) of the sample to be investigated ([6], [8]). Alternatively, Q can also be approximated by the reflection coefficient ([6], [8]) which can be determined in a locally resolved manner, from reflection measurements of the sample by detecting the direct reflection, using the described measuring method.

The PSD function can be determined by measurements at at least two support points, i.e. different spatial frequencies f or different angles of incidence, and subsequent extrapolation to the entire spatial frequency range of interest. The extrapolation is advantageously possible, because the PSD function generally extends continuously and without abrupt jumps, for polished and coated surfaces, such that just a few sampling points are sufficient.

The rms roughness σ can be calculated, as the roughness feature of the relevant surface section, from the PSD function, according to $$\sigma^2 = 2\pi \int PSD(f) f df \quad (6)$$

(see e.g. [4]).

Alternatively, the roughness can be calculated for example from the average PSD function within the surface section.

After identification of defects 5 in step S2, these are cut out, in steps S9 and S10, by using digital masks within the scattered light images 4A, 4B, 4C, 4D, ..., in order to subsequently calculate a particle diameter, in step S11, from the image data, e.g. from the number of detector pixels that cover the defect, and the imaging properties of the detector device. Alternatively, an identified small particle can also be calculated for example from the scattered light images using a particle scattering model, such as [7].

Alternatively or in addition to the above-mentioned use of digital masks which are adapted to the deterministic structures to be cut out (surface sections 2), analysis masks in the evaluation device 30 can also be adapted for covering image sections between the deterministic structures.

FIG. 1 schematically shows that at least one review process Rev can be performed using the evaluation device 30, in order to identify further information relating to the surface sections or the defects. The at least one review process Rev is performed depending on the result of the identification of the at least one roughness feature, preferably by means of a topographic measuring method, such as white light interferometry and/or an AFM. Alternatively or in addition, at least one review process Rev may be provided which is based on the method according to the invention and provides additional or more precise information, e.g. in which further scatter angels and/or further wavelengths and/or phase information is evaluated.

The roughness and/or the properties of the defects in the measuring region 3 are recorded and optionally output as a result. In order to measure the entire surface of the ESC 1, the ESC 1, together with the sample holder 40, is moved repeatedly, relative to the illumination and detector devices 20, 30, and measured in each position.

FIG. 2 shows a modified variant of the embodiment according to FIG. 1, a further detector device 20A comprising a detector array 21A and an imaging optic 22A being provided in addition to the detector device 20. By way of example, an illumination device 10 comprising two light sources 11A, 11B, each having an imaging optics 12, is shown, it being possible in practice for more light sources to be provided. The light sources 11A, 11B illuminate the measuring region 3 alternately, in succession, at two different angles of incidence. An evaluation device (not shown in FIG. 2) is provided for processing scattered light images, as is described with reference to FIG. 1. By way of example, tilting of the detector array 21A is shown, which may be provided for uniform focus (Scheimpflug principle).

The first detector device 20 is arranged having the detector array 21 and the imaging optics 22 at a 0° viewing angle for recording at least two scattered light images, as is described with reference to FIG. 1. The further detector device 20A is arranged at a different viewing angle relative to the surface normal of the surface of for example 60°. According to the described time control, the light sources 11A, 11B are activated alternately, in order to record scattered light images at the different angles of incidence. The first and the further detector device 20, 20A record two scattered light images of the illuminated measuring region 3, at the different viewing angles, for each angle of incidence. It is advantageously possible to thereby detect scattering features with high spatial frequencies. The recording of the scattered light images by means of the first and the further detector device 20, 20A preferably takes place simultaneously.

Alternatively or in addition, the detector devices may have different spectral sensitivities. This advantageously allows for the use of illumination wavelengths within a larger spectral range. Furthermore, instances of illumination having different wavelengths can also be performed simultaneously, the separation of the wavelengths then taking place on account of the different spectral sensitivities of the detector devices. Beam splitting optics would furthermore make it possible to use a plurality of detector devices at the same viewing angle, but different spectral sensitivities or polarisation sensitivities. A separation of this kind is advantageous for improving the measuring speed or for improving the sensitivity to individual structures or defects, or for improving the ability to distinguish different structures or defects.

According to a second embodiment of the invention, which is illustrated in FIGS. 3 and 4, the scattered light images are recorded simultaneously, and intensity control of the light sources 11A, 11B, 11C is provided such that the illumination device 20 provides different illumination intensities in the measuring region 3 by the illumination beam paths.

The direct calculation of the rms roughness $\sigma$ for each pixel, from the total scattering TS, by means of the evaluation device (not shown in FIG. 3) is carried out according to $$\sigma^2 = TS \frac{\lambda^2}{R(4\pi)^2} \quad (7)$$

(see [5]), TS being calculated from the total hemispherically scattered power $P_{TS}$ and the incident power $P_i$ (TS=$P_{TS}/P_i$), and R denoting the reflection coefficient of the surface investigated. The total scattering is acquired according to ISO13696 for a polar scattering angle $\theta_s$ in an angular range of from at least 2° to 85°. However, the measurement of the roughness that is described here also applies analogously for smaller angular ranges; in this case the measurement variable is referred to as usual as the integral scattering.

In order to obtain, using the detector device 20, scattered light images having scattered light amplitudes which are proportional to the total scattering or integral scattering, a weighting G of the irradiances E=$\Delta P_i/\Delta A$ of the individual instances of illumination is performed, where $\Delta P_i$ denotes the power incident on the surface element $\Delta A$ in the measuring region 3. The surface element $\Delta A$ may correspond to a detector pixel. As a result, all the instances of illumination can illuminate the sample (ESC 1) simultaneously. Although the angle resolved information of the scatter distribution ARS($\theta_s,\phi_s$) is lost, such that the PSD function can no longer be calculated, the proportionality to the total scattering means that time control of the light sources 11A, 11B, 11C is no longer required, such that a roughness measurement can be performed by means of one single simultaneous image recording in the event of illumination at all the angles of incidence. The measuring time can advantageously be significantly reduced as a result.

The determination of the at least one roughness feature in the second embodiment, comprising intensity control of the light sources (FIG. 3), is based on a modification of the determination, known from the prior art, of the total scattering, as is described in the following.

In the prior art, the total scattering is determined by quasi-perpendicular illumination and direct hemispherical detection. The hemispherical detection is typically achieved, in technical terms, using a Coblentz or Ulbricht sphere [8], such that the light is integrally collected and deflected to a detector. Alternatively, the total scattering is determined by means of numerical integration from measurement data of the angle resolved scattering, in the case of quasi-perpendicular light incidence and scanning of the scattered light hemisphere [8]:

$$TS = \int_0^{2\pi}\int_{2°}^{85°} ARS(\theta_s,\phi_s) \sin\theta_s d\theta_s d\phi_s \quad (8)$$

In the case of isotopically scattering surfaces, the ARS is rotationally symmetrical about the surface normal, in the case of perpendicular viewing by the camera. It is then sufficient to determine the angle resolved scattering ARS at an azimuthal angle $\phi_s$, the following then applying $$TS = 2\pi \int_{2°}^{85°} ARS(\theta_s) \sin\theta_s d\theta_s \quad (9)$$

In contrast, when determining the total scattering in the second embodiment of the invention, the incident direction and detection direction are exchanged. When the propagation direction is swapped, the ARS changes to ARS($\theta_s$) =ARS($\theta_i$) cos($\theta_i$)/cos($\theta_s$). Following rearrangement, the following results $$TS = 2\pi \int_{2°}^{85°} ARS(\theta_i) \cos\theta_i/\cos\theta_s \sin\theta_i d\theta_i \quad (10)$$

The scatter distribution ARS of a sample is detected by the individual illumination instances at the angles $\theta$ and $\phi$, or, in the case of one dimension, only at $\theta$. In the case of perpendicular viewing using the detector device 20, where $\theta_s=0°$, and scanning of the ARS at N instances of illumination having the angles of incidence $\theta_1$ to $\theta_N$ (see FIG. 4A) and $\phi=0$, where $0>\theta_1>\theta_N$, the integral of TS is calculated according to $$TS = 2\pi \cdot \Sigma_{\theta_1}^{\theta_N} ARS_N(\theta_N) \cdot \cos(\theta_N) \cdot \sin(\theta_N) \cdot \Delta\theta_N \quad (11),$$

where $\Delta\theta$ is the representative full angle of the relevant illumination (see FIG. 4a) or the step angle between the instances of illumination.

It is evident that the signals $ARS_N$ have to be weighted differently, in order to achieve a measuring signal that is proportional to TS. This weighting of the measuring signals $ARS(\theta_N)$ is performed in the measuring methods by weighting the individual irradiances. The weighting factor is then calculated according to $$G(\theta_N) = \cos\theta_N \sin\theta_N \Delta\theta_N \quad (12)$$

This results in the following, for the irradiances E=$\Delta P_i/\Delta A$ of the individual instances of illumination of each light source on the surface elements $\Delta A$ in the measuring region 3:

$$E(\theta_N) = E_0 G = E_0 \cos\theta_N \sin\theta_N \Delta\theta_N, \quad (13)$$

where $E_0$ is an irradiance which is preferably selected such that the overall illumination on the surface elements in the measuring region 3 results in a favourable signal-to-noise ratio in the event of camera detection. If, in the case of an individual or a plurality of polar angle(s) $\theta_N$, a plurality of light sources is used in each case, which light sources are arranged at different azimuthal angles, said light sources should preferably be of the same irradiance, the overall irradiance E($\theta_N$) thereof also corresponding to equation 13.

In order to calculate the TS value from the detector measurement signal of the sample, with the described illumination weighting, a calibration sample having a known TS value is used, as is known from the prior art.

Since in the case of scatter angles around the specular reflection the ARS typically extends very steeply, it is advantageous to keep the solid angle as small as possible, in this region, in order to reduce measurement uncertainties. In the case of wide angles relative to the specular reflection, the ARS extends in a shallower manner and the scattered powers are significantly lower. In this region, it is advantageous to select the spacings of the scanning and the solid angle so as to be large.

In order to provide a uniform illumination of the sample in the measuring region (3) and at the individual angles $\theta_N$ (see FIG. 4B), beamforming optics or location-variable reducers 13, e.g. grey filters, or corresponding actuation of the light sources at different energies, i.e. different powers, pulse durations, or pulse width modulations, may be provided.

The embodiment according to FIG. 3 makes it possible to measure rms roughnesses having a spatial frequency spectrum which is determined by the smallest and the largest angle of incidence of the light sources and the wavelength $\lambda_1$ (see equation 1). In order to expand the spatial frequency range, it is possible for further illumination wavelengths $\lambda_N$ to be used, which also simultaneously illuminate the sample at the existing wavelength.

Since the calculation of the rms roughness is dependent on the wavelength (see above), in this case the illumination intensities of the instances of illumination having different wavelengths are also adapted to one another. Since the sample-specific reflection coefficient is also dependent on the measuring wave, it is preferable to also correct this by adjustment of the wavelengths. The following additional weighting factor applies, for the individual instances of illumination, when using a plurality of measuring wavelengths:

$$G(\lambda_N) = \left(\frac{\lambda_N}{\lambda_1}\right)^2 \frac{R_1}{R_N} \qquad (14)$$

If the detector device 20 also has a spectral sensitivity, this is corrected accordingly.

In the following, preferred features of the invention are summarized.

A measuring apparatus (100) which is configured for roughness and/or defect measurement on a plurality of surface sections (2) of a surface of a sample (1) to be investigated, comprises an illumination device (10) having at least two light sources (11A, 11B, 11C, 11D) which are arranged for illuminating a measuring region (3) of the surface with measuring light, a detector device (20) having a detector array (21) with a plurality of detector pixels which are arranged for capturing scattered light scattered at the surface, and an evaluation device (30) which is configured for determining at least one roughness feature of the surface, from the captured scattered light, wherein the at least two light sources (11A, 11B, 11C, 11D) are configured for illuminating the measuring region (3) along at least two illumination beam paths (LA, LB, LC, LD) at different angles of incidence relative to a surface normal of the surface, wherein the at least two light sources (11A, 11B, 11C, 11D) are capable to be fixed with respect to the detector device (20), the detector device (20) is provided with an imaging optic (22) being arranged for imaging the measuring region (3) of the surface on the detector array (21), the detector device (20) is configured for capturing at least two scattered light images (4A, 4B, 4C, 4D) of surface sections (2) in the illuminated measuring region (3) at a predetermined viewing angle relative to the surface normal of the surface, wherein portions of the scattered light received by the detector pixels, which portions are formed in each case by the illumination in one of the illumination beam paths (LA, LB, LC, LD), in each case have a common spatial frequency, and the evaluation device (30) is configured for determining the at least one roughness feature of the surface sections (2) from the at least two scattered light images (4A, 4B, 4C, 4D).

The illumination device (10) may be configured for a time control of the at least two light sources (11A, 11B, 11C, 11D), such that the at least two scattered light images (4A, 4B, 4C, 4D) can be recorded successively and in a temporally separated manner, the evaluation device (30) is configured for determining power spectral density functions (PSD functions) of the surface sections (2) in the illuminated measuring region (3), from the at least two scattered light images (4A, 4B, 4C, 4D), and the evaluation device (30) is configured for calculating the at least one roughness feature for each surface section (2), from the PSD function or from the integral scattering of the surface section (2).

The illumination device (10) may be configured for an intensity control such that it is possible for the at least two scattered light images (4A, 4B, 4C, 4D) to be recorded at each of the surface sections (2) with weighted irradiances of the directed illumination by the at least two light sources (11A, 11B, 11C, 11D), wherein the weighted irradiances of the directed illumination are provided in that the irradiances are set such that the illumination by the light sources corresponds to a uniform hemispherical illumination, the evaluation device (30) is configured for determining an integral scattering of the structured surface in the illuminated measuring region (3), from the at least two scattered light images (4A, 4B, 4C, 4D), and the evaluation device (30) is configured for calculating the at least one roughness feature for each surface section (2), from the integral scattering on the surface section (2).

Preferably, at least one of the features is provided, including the number of light sources (11A, 11B, 11C, 11D) of the illumination device (10) is selected so as to be in the range of 3 to 100, the illumination device (10) is configured for generating the measuring light in all the illumination beam paths (LA, LB, LC, LD) so as to be of the same wavelength, and the illumination device (10) is configured for generating the measuring light in the illumination beam paths (LA, LB, LC, LD) so as to be of different wavelengths and/or different polarisations. If the illumination device (10) is configured for generating the measuring light in the illumination beam paths (LA, LB, LC, LD) so as to be of different wavelengths and/or different polarisations, the illumination device (10) preferably is configured for generating the measuring light in at least one of the illumination beam paths (LA, LB, LC, LD) so as to be of at least two different wavelengths and/or at least two different polarisations.

The illumination device (10) may be configured for generating the measuring light in the illumination beam paths (LA, LB, LC, LD) so as to be of different wavelengths, the evaluation device (30) is configured for determining at least two PSD functions and/or at least two instances of integral scattering of the surface sections (2) in the illuminated measuring region (3), and the evaluation device (30) is configured for identifying structures on the surface sections (2) from the at least two PSD functions and/or at least two instances of integral scattering.

Preferably, the evaluation device (30) is configured for identifying the surface sections (2) in the measuring region (3) by using digital image masks. Preferably, the evaluation device (30) is configured for identifying the surface sections (2) by using neural networks and/or machine learning methods, and/or the evaluation device (30) is configured for identifying structures on the surface sections (2) from the at least two scattered light images (4A, 4B, 4C, 4D) by using digital image masks.

The imaging optic (22) of the detector device (20) may be a telecentric optic, and/or the viewing angle of the detector device (20) may extend in parallel with the surface normal.

Preferably, the illumination device (10) is configured for directed illumination of the surface sections (2) at a shallow angle of incidence in the range of 88° to 75° using measuring light having a small wavelength $\lambda<300$ nm, and the evaluation device (30) is configured for determining a skewness parameter of the surface sections (2).

At least one further detector device (20A) may be provided, comprising an imaging optic (22A) and a detector array (21A) with a plurality of detector pixels, wherein the at least one further detector device (20A) is configured for capturing at least one scattered light image (4A, 4B, 4C, 4D of the illuminated measuring region (3) at at least one further viewing angle relative to the surface normal of the surface.

Preferably, the at least two light sources (11A, 11B, 11C, 11D) comprise at least one of light-emitting diodes, lasers, and optical fibres which are coupled to at least one light-emitting diode and/or at least one laser, and/or each light source is provided with illumination optics (12).

Optionally, a sample holder (40) for receiving the sample (1), and/or the assembly consisting of the illumination device (10) and the detector device (20), are movable relative to one another, such that the illumination device (10) can be arranged for illuminating different measuring regions of the structured surface, and the scattered light images (4A, 4B, 4C, 4D) of the different measuring regions can be captured by the detector device (20), and the measuring apparatus (100) is configured for repeated roughness measurement at the surface sections (2) in the different measuring regions of the structured surface.

The illumination device (10) and the detector device (20, 20A) may be arranged for capturing the scattered light from the sample (1) in reflection and/or transmission.

A method for roughness and/or defect measurement on surface sections (2) of a surface of a sample to be investigated, comprises the steps of illuminating a measuring region (3) of the surface with measuring light, the measuring region (3) containing the plurality of surface sections (2), capturing scattered light scattered at the surface, using a detector device (20) having a detector array (21) with a plurality of detector pixels, and determining at least one roughness feature of the surface, from the captured scattered light, wherein the illumination comprises directed illumination of the surface sections (2) in the measuring region (3) using at least two fixedly arranged light sources (11A, 11B, 11C, 11D) along at least two illumination beam paths (LA, LB, LC, LD) at different angles of incidence relative to a surface normal of the surface, the detector device (20) is provided with imaging optics (22), by means of which the measuring region (3) of the surface is imaged on the detector array (21), the detector device (20) captures at least two scattered light images (4A, 4B, 4C, 4D) of the illuminated measuring region (3) at a predetermined viewing angle relative to the surface normal of the surface, and portions of the scattered light received by the detector pixels, in each of the illumination beam paths (LA, LB, LC, LD), in each case have a common spatial frequency, and the at least one roughness feature is determined, for each surface section (2), from the at least two scattered light images (4A, 4B, 4C, 4D).

A time control of the at least two light sources (11A, 11B, 11C, 11D) may be provided such that the at least two scattered light images (4A, 4B, 4C, 4D) are recorded in a manner temporally separated from one another, wherein power spectral density functions (PSD functions) of the surface sections (2) in the illuminated measuring region (3) are determined from the at least two scattered light images (4A, 4B, 4C, 4D), and the at least one roughness feature is calculated, for each surface section (2), from the PSD function or the integral scattering of the surface section (2).

An intensity control may be provided such that the at least two scattered light images (4A, 4B, 4C, 4D) are recorded at each of the surface sections (2) with weighted irradiances of the directed illumination by the at least two light sources (11A, 11B, 11C, 11D), wherein the weighted irradiances of the directed illumination are provided in that the irradiances are set such that the light sources generate a uniform hemispherical illumination, wherein an integral scattering of the structured surface in the illuminated measuring region (3) is determined from the at least two scattered light images (4A, 4B, 4C, 4D), and the at least one roughness feature is calculated, for each surface section (2), from the integral scattering on the surface section (2).

The measuring light in all the illumination beam paths (LA, LB, LC, LD) may be generated so as to be of the same wavelength.

The measuring light in the illumination beam paths (LA, LB, LC, LD) may be generated so as to be of different wavelengths and/or different polarisations. Preferably, the measuring light in at least one of the illumination beam paths (LA, LB, LC, LD) is generated so as to be of at least two different wavelengths and/or at least two different polarisations, and/or at least two PSD functions and/or at least two instances of integral scattering of the surface sections (2) in the illuminated measuring region (3) are determined, wherein structures on the surface sections (2) are acquired from the at least two PSD functions and/or at least two instances of integral scattering.

An identification of the surface sections (2) in the at least two scattered light images (4A, 4B, 4C, 4D) may be provided. Preferably, the surface sections (2) are identified by using neural networks and/or machine learning methods, and/or the structures on the surface sections (2) are identified from the at least two scattered light images (4A, 4B, 4C, 4D) by using digital image masks.

The surface sections (2) may be illuminated at a shallow angle of incidence in the range of 88° to 75° using measuring light having a small wavelength $\lambda<300$ nm, wherein a skewness parameter of the surface sections (2) is determined from the scattered light images (4A, 4B, 4C, 4D).

Preferably, at least one further detector device (20) may be provided, comprising an imaging optic (22) and a detector array (21) with a plurality of detector pixels, wherein at least one scattered light image (4A, 4B, 4C, 4D of the illuminated measuring region (3) is captured at at least one further viewing angle relative to the surface normal of the surface.

A plurality of different measuring regions of the structured surface may be illuminated, and scattered light images (4A, 4B, 4C, 4D) of the different measuring regions are acquired by means of the detector device (20), wherein the roughness measurement at the surface sections (2) is repeated in the different measuring regions of the structured surface.

Preferably, selected surface sections, in particular having increased roughness and/or increased deviations between at least two PSD functions and/or at least two instances of integral scattering of the surface sections (2), are purposely investigated using an interferometric, topographic and/or spectroscopic measuring method, in particular interferometry, confocal microscopy, fluorescence spectroscopy, or Raman spectroscopy.

The surface or selected surface sections may be subjected to a focus variation measurement and/or a Makyoh imaging measurement, in order to determine a height profile, in particular a local surface inclination of the surface.

Preferably, the sample (1) to be investigated comprises a holding apparatus for holding components, wherein a plurality of protruding burls are arranged on the surface of the holding apparatus, and the surface sections (2) comprise end faces of the burls.

The scattered light from the sample (1) may be captured in reflection and/or transmission.

Embodiments are provided according to the following clauses:

1. Measuring apparatus (100) which is configured for roughness and/or defect measurement on a plurality of surface sections (2) of a surface of a sample (1) to be investigated, comprising
    an illumination device (10) having at least two light sources (11A, 11B, 11C, 11D) which are arranged for illuminating a measuring region (3) of the surface with measuring light,
    a detector device (20) having a detector array (21) with a plurality of detector pixels which are arranged for capturing scattered light scattered at the surface, and
    an evaluation device (30) which is configured for determining at least one roughness feature of the surface, from the captured scattered light,
    characterised in that:
    the at least two light sources (11A, 11B, 11C, 11D) are configured for illuminating the measuring region (3) along at least two illumination beam paths (LA, LB, LC, LD) at different angles of incidence relative to a surface normal of the surface, wherein the at least two light sources (11A, 11B, 11C, 11D) are capable to be fixed with respect to the detector device (20),
    the detector device (20) is provided with an imaging optic (22) being arranged for imaging the measuring region (3) of the surface on the detector array (21),
    the detector device (20) is configured for capturing at least two scattered light images (4A, 4B, 4C, 4D) of surface sections (2) in the illuminated measuring region (3) at a predetermined viewing angle relative to the surface normal of the surface, wherein portions of the scattered light received by the detector pixels, which portions are formed in each case by the illumination in one of the illumination beam paths (LA, LB, LC, LD), in each case have a common spatial frequency, and
    the evaluation device (30) is configured for determining the at least one roughness feature of the surface sections (2) from the at least two scattered light images (4A, 4B, 4C, 4D).

2. Measuring apparatus according to claim 1, wherein:
    the illumination device (10) is configured for a time control of the at least two light sources (11A, 11B, 11C, 11D), such that the at least two scattered light images (4A, 4B, 4C, 4D) can be recorded successively and in a temporally separated manner,
    the evaluation device (30) is configured for determining power spectral density functions (PSD functions) of the surface sections (2) in the illuminated measuring region (3), from the at least two scattered light images (4A, 4B, 4C, 4D), and
    the evaluation device (30) is configured for calculating the at least one roughness feature for each surface section (2), from the PSD function or from the integral scattering of the surface section (2).

3. Measuring apparatus according to any of the preceding claims, wherein:
    the illumination device (10) is configured for an intensity control such that it is possible for the at least two scattered light images (4A, 4B, 4C, 4D) to be recorded at each of the surface sections (2) with weighted irradiances of the directed illumination by the at least two light sources (11A, 11B, 11C, 11D), wherein the weighted irradiances of the directed illumination are provided in that the irradiances are set such that the illumination by the light sources corresponds to a uniform hemispherical illumination,
    the evaluation device (30) is configured for determining an integral scattering of the structured surface in the illuminated measuring region (3), from the at least two scattered light images (4A, 4B, 4C, 4D), and
    the evaluation device (30) is configured for calculating the at least one roughness feature for each surface section (2), from the integral scattering on the surface section (2).

4. Measuring apparatus according to any of the preceding claims, having at least one of the features:
    the number of light sources (11A, 11B, 11C, 11D) of the illumination device (10) is selected so as to be in the range of 3 to 100;
    the illumination device (10) is configured for generating the measuring light in all the illumination beam paths (LA, LB, LC, LD) so as to be of the same wavelength, and
    the illumination device (10) is configured for generating the measuring light in the illumination beam paths (LA, LB, LC, LD) so as to be of different wavelengths and/or different polarisations.

5. Measuring apparatus according to claim 4, wherein:
    the illumination device (10) is configured for generating the measuring light in the illumination beam paths (LA, LB, LC, LD) so as to be of different wavelengths and/or different polarisations, and
    the illumination device (10) is configured for generating the measuring light in at least one of the illumination beam paths (LA, LB, LC, LD) so as to be of at least two different wavelengths and/or at least two different polarisations.

6. Measuring apparatus according to claim 4 or claim 5, wherein:
    the illumination device (10) is configured for generating the measuring light in the illumination beam paths (LA, LB, LC, LD) so as to be of different wavelengths,
    the evaluation device (30) is configured for determining at least two PSD functions and/or at least two instances of integral scattering of the surface sections (2) in the illuminated measuring region (3), and
    the evaluation device (30) is configured for identifying structures on the surface sections (2) from the at least two PSD functions and/or at least two instances of integral scattering.

7. Measuring apparatus according to any of the preceding claims, wherein the evaluation device (30) is configured for identifying the surface sections (2) in the measuring region (3) by using digital image masks.

8. Measuring apparatus according to claim 7, wherein the evaluation device (30) is configured for identifying the surface sections (2) by using neural networks and/or machine learning methods.

9. Measuring apparatus according to claim 7 or claim 8, wherein the evaluation device (30) is configured for identifying structures on the surface sections (2) from the at least two scattered light images (4A, 4B, 4C, 4D) by using digital image masks.

10. Measuring apparatus according to any of the preceding claims, wherein:
the imaging optic (22) of the detector device (20) is a telecentric optic, and/or
the viewing angle of the detector device (20) extends in parallel with the surface normal.

11. Measuring apparatus according to any of the preceding claims, wherein:
the illumination device (10) is configured for directed illumination of the surface sections (2) at a shallow angle of incidence in the range of 88° to 75° using measuring light having a small wavelength $\lambda$<300 nm, and
the evaluation device (30) is configured for determining a skewness parameter of the surface sections (2).

12. Measuring apparatus according to any of the preceding claims, wherein at least one further detector device (20A) is provided, comprising an imaging optic (22A) and a detector array (21A) with a plurality of detector pixels, wherein the at least one further detector device (20A) is configured for capturing at least one scattered light image (4A, 4B, 4C, 4D) of the illuminated measuring region (3) at at least one further viewing angle relative to the surface normal of the surface.

13. Measuring apparatus according to any of the preceding claims, wherein:
the at least two light sources (11A, 11B, 11C, 11D) comprise at least one of light-emitting diodes, lasers, and optical fibres which are coupled to at least one light-emitting diode and/or at least one laser, and/or
each light source is provided with illumination optics (12).

14. Measuring apparatus according to any of the preceding claims, wherein:
a sample holder (40) for receiving the sample (1), and/or the assembly consisting of the illumination device (10) and the detector device (20), are movable relative to one another, such that the illumination device (10) can be arranged for illuminating different measuring regions of the structured surface, and the scattered light images (4A, 4B, 4C, 4D) of the different measuring regions can be captured by the detector device (20), and
the measuring apparatus (100) is configured for repeated roughness measurement at the surface sections (2) in the different measuring regions of the structured surface.

15. Method for roughness and/or defect measurement on surface sections (2) of a surface of a sample to be investigated, comprising the steps of:
illuminating a measuring region (3) of the surface with measuring light, the measuring region (3) containing the plurality of surface sections (2),
capturing scattered light scattered at the surface, using a detector device (20) having a detector array (21) with a plurality of detector pixels, and
determining at least one roughness feature of the surface, from the captured scattered light,
characterised in that:
the illumination comprises directed illumination of the surface sections (2) in the measuring region (3) using at least two fixedly arranged light sources (11A, 11B, 11C, 11D) along at least two illumination beam paths (LA, LB, LC, LD) at different angles of incidence relative to a surface normal of the surface,
the detector device (20) is provided with imaging optics (22), by means of which the measuring region (3) of the surface is imaged on the detector array (21),
the detector device (20) captures at least two scattered light images (4A, 4B, 4C, 4D) of the illuminated measuring region (3) at a predetermined viewing angle relative to the surface normal of the surface, and portions of the scattered light received by the detector pixels, in each of the illumination beam paths (LA, LB, LC, LD), in each case have a common spatial frequency, and
the at least one roughness feature is determined, for each surface section (2), from the at least two scattered light images (4A, 4B, 4C, 4D).

The features of the invention disclosed in the above description, the drawings, and the claims, can be of significance both individually and in combination or sub-combination for implementing the invention in the various embodiments thereof.

The invention claimed is:

1. An apparatus configured for roughness and/or defect measurement on a surface of a sample to be investigated, the apparatus comprising:
an illumination device having at least two radiation sources that are configured to illuminate a measuring region of the surface with measuring radiation, the at least two sources configured to illuminate the measuring region along at least two illumination beam paths at different angles of incidence relative to a surface normal of the surface;
a detector device having a detector array with a plurality of detector pixels which are arranged to capture scattered radiation scattered at the surface, the detector device comprising an imaging optic arranged to image the measuring region of the surface on the detector array and the detector device configured to capture at least two scattered radiation images of surface sections in the illuminated measuring region at a predetermined viewing angle relative to the surface normal of the surface, wherein portions of the scattered radiation received by the detector pixels, which portions are formed in each case by the illumination in one of the illumination beam paths, in each case have a common spatial frequency; and
an evaluation device configured to determine at least one roughness feature of the surface sections from the at least two scattered radiation images,
wherein the at least two sources are capable to be fixed with respect to the detector device.

2. The apparatus according to claim 1, wherein:
the illumination device is configured for a time control of the at least two sources such that the at least two scattered radiation images can be recorded successively and in a temporally separated manner, the evaluation device is configured to determine power spectral density functions of the surface sections in the illuminated measuring region, from the at least two scattered radiation images, and the evaluation device is configured to determine the at least one roughness feature for each surface section, from the PSD function or from integral scattering of the surface section.

3. The apparatus according to claim 1, wherein:

the illumination device is configured for an intensity control such that it is possible for the at least two scattered radiation images to be recorded at each of the surface sections with weighted irradiances of the directed illumination by the at least two sources, wherein the weighted irradiances of the directed illumination are provided such that the irradiances are set such that the illumination by the at least two sources corresponds to a uniform hemispherical illumination, the evaluation device is configured to determine an integral scattering of the surface in the illuminated measuring region, from the at least two scattered radiation images, and the evaluation device is configured to determine the at least one roughness feature for each surface section, from the integral scattering on the surface section.

4. The apparatus according to claim 1, wherein:

the number of sources of the illumination device is selected so as to be in the range of 3 to 100, and/or the illumination device is configured to generate the measuring radiation in all the illumination beam paths so as to be of the same wavelength, and/or the illumination device is configured to generate the measuring radiation in the illumination beam paths so as to be of different wavelengths and/or different polarizations.

5. The apparatus according to claim 4, wherein:

the illumination device is configured to generate the measuring radiation in the illumination beam paths so as to be of different wavelengths and/or different polarizations, and the illumination device is configured to generate the measuring radiation in at least one of the illumination beam paths so as to be of at least two different wavelengths and/or at least two different polarizations.

6. The apparatus according to claim 4, wherein:

the illumination device is configured for generate the measuring radiation in the illumination beam paths so as to be of different wavelengths, the evaluation device is configured to determine at least two PSD functions and/or at least two instances of integral scattering of the surface sections in the illuminated measuring region, and the evaluation device is configured to identity structures on the surface sections from the at least two PSD functions and/or at least two instances of integral scattering.

7. The apparatus according to claim 1, wherein the evaluation device is configured to identify the surface sections in the measuring region by using digital image masks.

8. The apparatus according to claim 7, wherein the evaluation device is configured to identify the surface sections by using a neural network and/or a machine learning method.

9. The apparatus according to claim 7, wherein the evaluation device is configured to identify structures on the surface sections from the at least two scattered radiation images by using digital image masks.

10. The apparatus according to claim 1, wherein:

the imaging optic of the detector device is a telecentric optic, and/or the viewing angle of the detector device extends in parallel with the surface normal.

11. The apparatus according to claim 1, wherein:

the illumination device is configured to direct illumination of the surface sections at a shallow angle of incidence in the range of 88° to 75° using measuring radiation having a wavelength $\lambda < 300$ nm, and the evaluation device is configured to determine a skewness parameter of the surface sections.

12. The apparatus according to claim 1, further comprising at least one further detector device comprising an imaging optic and a detector array with a plurality of detector pixels, wherein the at least one further detector device is configured to capture at least one scattered radiation image of the illuminated measuring region at at least one further viewing angle relative to the surface normal of the surface.

13. The apparatus according to claim 1, wherein:

the at least two radiation sources comprise at least one selected from: a light-emitting diode, a laser, and/or an optical fiber coupled to at least one light-emitting diode and/or to at least one laser, and/or each source is provided with illumination optics.

14. The apparatus according to claim 1, further comprising a sample holder configured to receive the sample, wherein the sample holder and an assembly comprising the illumination device and the detector device are configured enable relative movement therebetween such that the illumination device can illuminate different measuring regions of the surface and scattered radiation images of the different measuring regions can be captured by the detector device, and the apparatus is configured for repeated roughness measurement in the different measuring regions of the surface.

15. A method for roughness and/or defect measurement on a surface of a sample to be investigated, the method comprising:

illuminating a measuring region of the surface with measuring radiation, the illumination comprising directed illumination of surface sections in the measuring region using at least two fixedly arranged radiation sources along at least two illumination beam paths at different angles of incidence relative to a surface normal of the surface;

capturing scattered radiation scattered at the surface using a detector device having a detector array with a plurality of detector pixels, the capturing comprising capturing at least two scattered radiation images of the illuminated measuring region at a predetermined viewing angle relative to the surface normal of the surface, and portions of the scattered radiation received by the detector pixels, in each of the illumination beam paths, in each case have a common spatial frequency; and determining at least one roughness feature for each surface section from the at least two scattered radiation images.

16. The method according to claim 15, wherein:

the illuminating comprises illuminating with a time control of the at least two sources such that the at least two scattered radiation images can be recorded successively and in a temporally separated manner, and the determining comprises determining power spectral density functions of the surface sections in the illuminated measuring region, from the at least two scattered radiation images, and determining the at least one roughness feature for each surface section, from the PSD function or from integral scattering of the surface section.

17. The method according to claim 15, wherein
the illuminating comprising illuminating with an intensity control such that it is possible for the at least two scattered radiation images to be recorded at each of the surface sections with weighted irradiances of the directed illumination by the at least two sources, wherein the weighted irradiances of the directed illumination are provided such that the irradiances are set such that the illumination by the at least two sources corresponds to a uniform hemispherical illumination,
the determining comprising determining an integral scattering of the surface in the illuminated measuring region, from the at least two scattered radiation images, and determining the at least one roughness feature for each surface section, from the integral scattering on the surface section.

18. The method according to claim 15, wherein the determining comprises identifying the surface sections in the measuring region by using digital image masks.

19. The method according to claim 15, wherein the determining comprises identifying the surface sections by using a neural network and/or a machine learning method.

20. The method according to claim 15, wherein:
the illuminating comprises directing illumination of the surface sections at a shallow angle of incidence in the range of 88° to 75° using measuring radiation having a wavelength $\lambda<300$ nm, and
the determining comprises determining a skewness parameter of the surface sections.

* * * * *